United States Patent
Feldtkeller et al.

(10) Patent No.: US 9,741,601 B2
(45) Date of Patent: Aug. 22, 2017

(54) SEMICONDUCTOR COMPONENT WITH REGIONS ELECTRICALLY INSULATED FROM ONE ANOTHER AND METHOD FOR MAKING A SEMICONDUCTOR COMPONENT

(75) Inventors: Martin Feldtkeller, Munich (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/399,046

(22) Filed: Mar. 6, 2009

(65) Prior Publication Data
US 2009/0224264 A1   Sep. 10, 2009

(30) Foreign Application Priority Data
Mar. 6, 2008   (DE) .................. 10 2008 012 858

(51) Int. Cl.
| | | |
|---|---|---|
| H01L 21/76 | (2006.01) | |
| H01L 21/762 | (2006.01) | |
| H01L 23/50 | (2006.01) | |
| H01L 27/06 | (2006.01) | |
| H01L 31/153 | (2006.01) | |
| H01L 23/00 | (2006.01) | |
| H01L 21/8238 | (2006.01) | |
| H01L 23/495 | (2006.01) | |
| H01L 23/522 | (2006.01) | |
| H01L 27/08 | (2006.01) | |

(52) U.S. Cl.
CPC ........ *H01L 21/76224* (2013.01); *H01L 23/50* (2013.01); *H01L 24/24* (2013.01); *H01L 27/0623* (2013.01); *H01L 31/153* (2013.01); *H01L 21/823878* (2013.01); *H01L 23/495* (2013.01); *H01L 23/5227* (2013.01); *H01L 27/08* (2013.01); *H01L 2924/07802* (2013.01); *H01L 2924/12036* (2013.01); *H01L 2924/1305* (2013.01); *H01L 2924/14* (2013.01); *H01L 2924/181* (2013.01)

(58) Field of Classification Search
CPC ............................... H01L 23/50; H01L 24/24
USPC ...................... 438/404–414; 257/84, E27.01
See application file for complete search history.

(56) References Cited

U.S. PATENT DOCUMENTS

| | | | | |
|---|---|---|---|---|
| 4,785,345 A | * | 11/1988 | Rawls et al. .................. | 257/531 |
| 4,855,804 A | * | 8/1989 | Bergami et al. .............. | 257/622 |
| 5,356,827 A | * | 10/1994 | Ohoka .......................... | 438/234 |
| 5,407,841 A | | 4/1995 | Liao et al. | |
| 5,604,835 A | * | 2/1997 | Nakamura et al. ........... | 385/129 |
| 5,719,073 A | | 2/1998 | Shaw et al. | |
| 5,757,081 A | | 5/1998 | Chang | |
| 5,930,635 A | * | 7/1999 | Bashir et al. ................. | 438/313 |

(Continued)

OTHER PUBLICATIONS

Office Action, in the German language, from counterpart German Application No. 102008012858.9, dated Jul. 12, 2011, 10 pp.

(Continued)

*Primary Examiner* — Matthew Reames
(74) *Attorney, Agent, or Firm* — Shumaker & Sieffert, P.A.

(57) ABSTRACT

Semiconductor component comprising at least two semiconductor regions are disclosed. In one embodiment the semiconductor regions of the semiconductor component are electrically isolated from one another by an insulator, and a deposited, patterned, metallic layer extends over the semiconductor regions and over the insulator.

15 Claims, 5 Drawing Sheets

(56) References Cited

U.S. PATENT DOCUMENTS

| | | | |
|---|---|---|---|
| 5,949,225 A | 9/1999 | Sawtell | |
| 6,299,314 B1* | 10/2001 | Igarashi et al. | 257/288 |
| 6,460,411 B1 | 10/2002 | Kersjes et al. | |
| 2002/0132377 A1* | 9/2002 | Conchieri et al. | 438/5 |
| 2003/0057566 A1* | 3/2003 | Huang et al. | 257/777 |
| 2005/0153519 A1* | 7/2005 | Lu et al. | 438/424 |
| 2005/0217656 A1* | 10/2005 | Bender | 125/21 |
| 2007/0037384 A1* | 2/2007 | Su et al. | 438/637 |
| 2007/0158859 A1 | 7/2007 | Hierholzer | |
| 2008/0173972 A1* | 7/2008 | Gibson | 257/506 |

OTHER PUBLICATIONS

Office Action, in the German language, from counterpart German Application No. 102008012858.9, dated Mar. 18, 2015, 8 pp.

\* cited by examiner

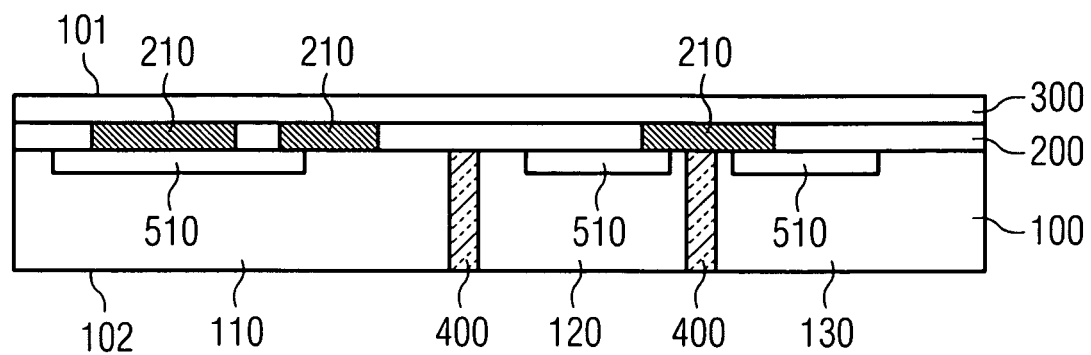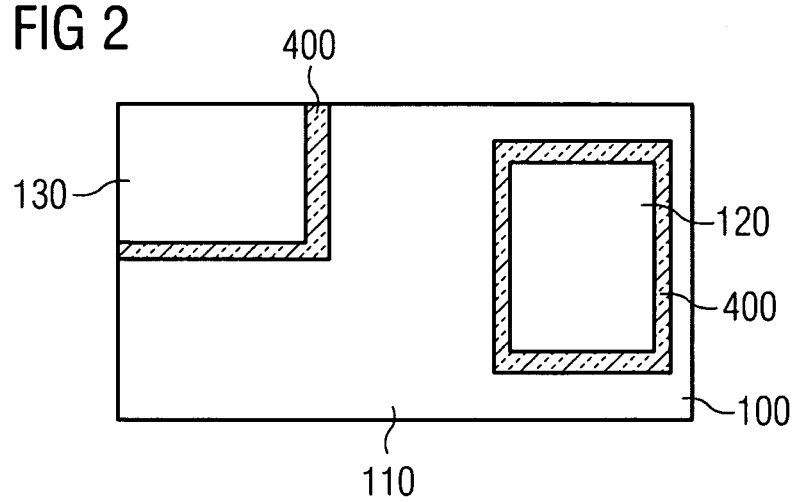

SEMICONDUCTOR COMPONENT WITH REGIONS ELECTRICALLY INSULATED FROM ONE ANOTHER AND METHOD FOR MAKING A SEMICONDUCTOR COMPONENT

RELATED APPLICATION

The present application claims priority to German Application No. 10 2008 012 858 filed Mar. 6, 2008, which is incorporated by reference herein in its entirety.

BACKGROUND OF THE INVENTION

Components on integrated circuits can be electrically insulated from one another in order that the components do not mutually influence one another in terms of their functions. In high-voltage applications, in particular, not just individual components but entire functional groups are arranged in a manner electrically insulated from one another. By way of example, in bridge arrangements, switches and driving circuits are constructed in electrically insulated fashion.

Junction-isolated monolithic high-voltage technologies are widespread. They can be used for half-bridge drivers. In the case of a half-bridge driver, part of the circuit is situated within a generally N-conducting region and is insulated from the rest of the circuit by lightly doped PN junctions in the reverse direction.

A signal flow for a high-side driver is effected from the driving circuit in the direction of the driver circuit by means of high-voltage NMOS transistors. The blocking capability of the PN junctions between the driving circuit and the high-voltage NMOS transistors determines the maximum supply voltage of the entire half-bridge circuit. High-voltage ICs of this type can be produced cost-effectively and operate comparatively slowly owing to the structure sizes required for the blocking capability. Customary signal transit times are of the order of magnitude of 500 ns. Furthermore, they are particularly susceptible to electromagnetic influencing owing to the weakly doped P- and N-type regions with long minority carrier lifetimes.

SOI technologies (Silicon on Insulator) are furthermore used, in the case of which a silicon wafer provided with an oxide layer can have a further silicon wafer bonded onto it. One of the two wafers can subsequently be eroded to a thin residual layer. The thin residual layer can have a thickness of a few 100 nm up to a few (m. Individual regions of the residual layer are electrically insulated from one another by means of a patterned etch. Circuit regions that are completely insulated from one another are thus obtained. The production costs are relatively high, and the circuits operate relatively rapidly compared with the structure sizes used. High-voltage NMOS transistors are likewise used for the signal flow, or the level conversion from the driving circuit to the driver circuit.

Furthermore, there is the possibility of providing circuit regions that are to be insulated from one another on separate chips and of mounting the chips into a housing in a manner insulated from one another. The signal transfer can be effected for example by means of air-core coil transformers integrated on a chip and having mutually insulated primary and secondary windings. One feature of this solution is that no special high-voltage technology is required. Since technologies having small structures and high packing density can be used for this purpose, the signal transfer is approximately a factor of 100 faster than by means of junction-isolated high-voltage technologies. The blocking capability of the insulation path is very high and independent of a polarity of the reverse voltage. By way of example, the number of chips increases with the number of half-bridges to be mounted. For a three-phase bridge driver, by way of example, four chips in a housing are required. The housing size and the mounting complexity increase with the number of chips. Monolithically integrated half-bridge drivers can be incorporated into smaller housings than half-bridge drivers having separate chips.

In order to increase the packing density in the case of monolithically integrated power circuits, by way of example, the lateral insulation of the components among one another can be implemented by means of isolation trenches. The isolation trenches require less space than the junction isolation that is otherwise customary. The isolation trenches reach from the chip surface down into a depth at which functional PN junctions no longer occur, that is to say down to a depth of approximately 10 . . . 20 μm. This depth is significantly smaller than the chip thickness.

SUMMARY OF THE INVENTION

In one embodiment a semiconductor component comprises at least two semiconductor regions, wherein the semiconductor regions of the semiconductor component are electrically isolated from one another by an insulator, and a deposited, patterned, metallic layer extends over the semiconductor regions and over the insulator.

A method for making a semiconductor component is also disclosed. In one embodiment the method comprises:

Providing a semiconductor component, introducing doping regions into the semiconductor component, etching a deep trench into the semiconductor component, filling said trench with an insulator, applying metal layers and insulation layers on the semiconductor component, reducing the thickness of the semiconductor component until the trench with the insulator completely penetrates through the semiconductor component.

BRIEF DESCRIPTION OF THE DRAWINGS

Embodiments are explained in more detail below with reference to the following drawings, in which FIG. 1 shows the side view in section of an exemplary embodiment of a semiconductor component 110 comprising at least two regions 110, 120, 130, wherein the regions 110, 120, 130 are electrically isolated from one another by an insulator region 400, FIG. 2 shows the plan view of a further embodiment of a semiconductor component 100 comprising at least two regions 110, 120, 130, wherein the regions 110, 120, 130 are electrically isolated from one another by an insulator region 400.

DETAILED DESCRIPTION OF THE DRAWINGS

Figure 3:
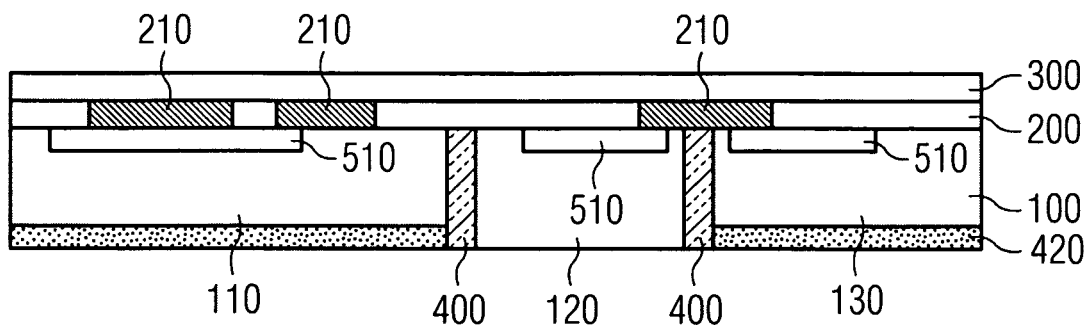
FIG. 3 shows the side view in section of a further exemplary embodiment of a semiconductor component 100.

FIG. 1 shows the side view in section of an embodiment of a semiconductor component 100 comprising at least two regions 110, 120, 130, wherein the regions 110, 120, 130 are electrically isolated from one another by an insulator region 400. The insulator of the insulator region 400 completely penetrates through the semiconductor component in a vertical direction. In the regions 110, 120, 130 of the semiconductor component 100, integrated components 510 are arranged on the first surface. The integrated components are connected to one another by metallic tracks 210. The metallic tracks are arranged in at least one patterned layer 200 arranged above the first surface of the semiconductor component 100. A further patterned layer 300, which contains an oxide or a nitride, is arranged above the semiconductor component 100. The patterned layers 200, 300 arranged on the first surface electrically connect the components arranged on the first surface, and the oxide or nitride layers insulate the metallic tracks in a vertical direction with respect to the surface of the semiconductor component 100.

The insulator 400 is arranged in the semiconductor component 100 in such a way that it electrically insulates the regions 110, 120, 130 of the semiconductor component 100 by reaching from the first as far as the second surface of the semiconductor component 100.

FIG. 2 shows the plan view of an exemplary embodiment of a semiconductor component 100 comprising at least two regions 110, 120, 130, wherein the regions 110, 120, 130 are electrically isolated from one another by an insulator region 400. FIG. 2 shows a region 120 situated within the region 110. For insulation purposes, the insulator region 400 completely encompasses the region 120. A further example is shown by the region 130. Since the region 130 is arranged at the edge of the semiconductor component 100, a complete encompassment by an insulator region 400 is not necessary.

FIG. 3 shows the side view in section of an exemplary embodiment of a semiconductor component 100 comprising at least two regions 110, 120, 130, wherein the regions 110, 120, 130 are electrically isolated from one another by an insulator region 400. The insulator of the insulator region 400 completely penetrates through the semiconductor component in a vertical direction. In the regions 110, 130, in this exemplary embodiment, a semiconductor zone 420 of the complementary type with respect to the semiconductor component 100 is applied on the second surface. The application of a semiconductor zone 420 can be effected in patterned fashion under selected regions or over the whole area.

Figure 4:
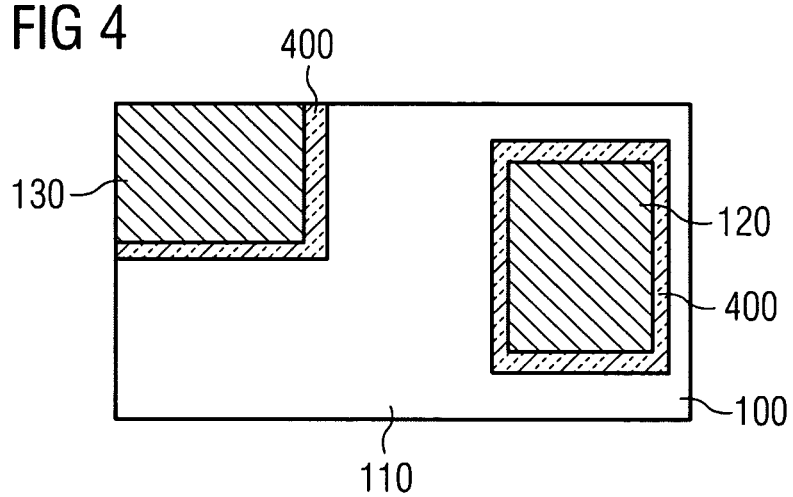
FIG. 4 shows the plan view of a further exemplary embodiment of a semiconductor component 100.

FIG. 4 shows the plan view of an exemplary embodiment of a semiconductor component 100 comprising at least two regions 110, 120, 130, wherein the regions 110, 120, 130 are electrically isolated from one another by an insulator region 400. The region 120 is a region situated within the region 110. For insulation purposes, the insulator region 400 completely encompasses the region 120. A further example is shown by the region 130. Since the region 130 is arranged at the edge of the semiconductor component 100, a complete encompassment by an insulator region 400 is not necessary. On the second surface of the regions 120, 130, in this exemplary embodiment, a semiconductor zone of the complementary type with respect to the semiconductor component is applied on the second surface.

Figure 5:
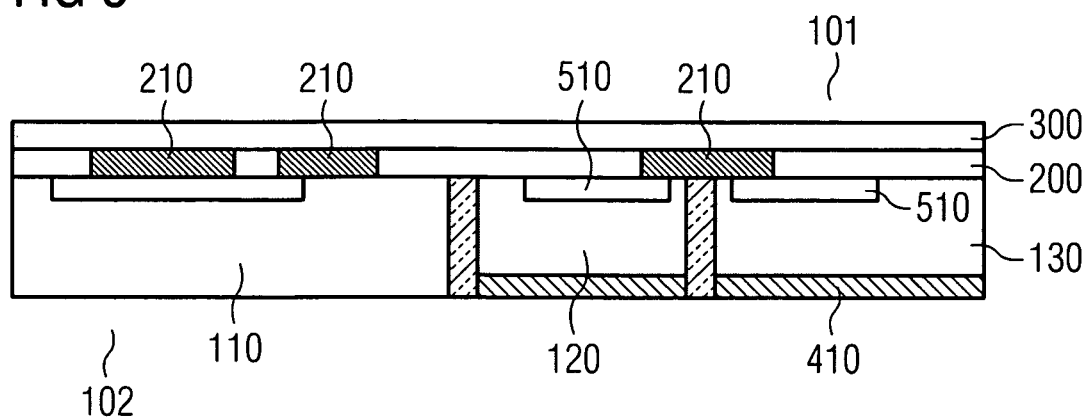
FIG. 5 shows the side view in section of a further exemplary embodiment of a semiconductor component 100.

FIG. 5 shows the side view in section of an exemplary embodiment of a semiconductor component 100 comprising at least two regions 110, 120, 130, wherein the regions 110, 120, 130 are electrically isolated from one another by an insulator region 400. The insulator of the insulator region 400 completely penetrates through the semiconductor component in a vertical direction. In the regions 110, 130, in this exemplary embodiment, a dielectric insulator 410 is applied on the second surface. The application of a semiconductor zone can be effected in patterned fashion under selected regions or over the whole area.

Figure 6:
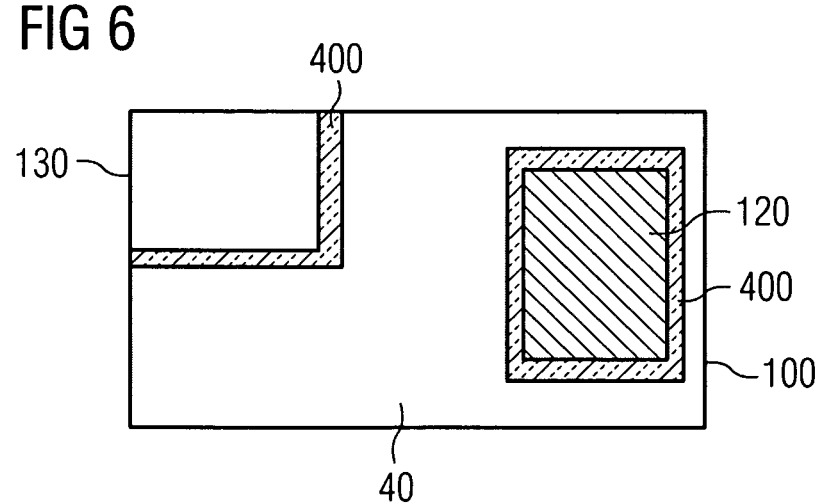
FIG. 6 shows the plan view of a further exemplary embodiment of a semiconductor component 100.

FIG. 6 shows the plan view of an exemplary embodiment of a semiconductor component 100 comprising at least two regions 110, 120, 130, wherein the regions 110, 120, 130 are electrically isolated from one another by an insulator region 400. The region 120 is a region situated within the region 110. For insulation purposes, the insulator region 400 completely encompasses the region 120. A further example is shown by the region 130. Since the region 130 is arranged at the edge of the semiconductor component 100, a complete encompassment by an insulator region 400 is not necessary. On the second surface of the regions 120, 130, in this exemplary embodiment, a dielectric insulator is applied on the second surface.

Figure 7:
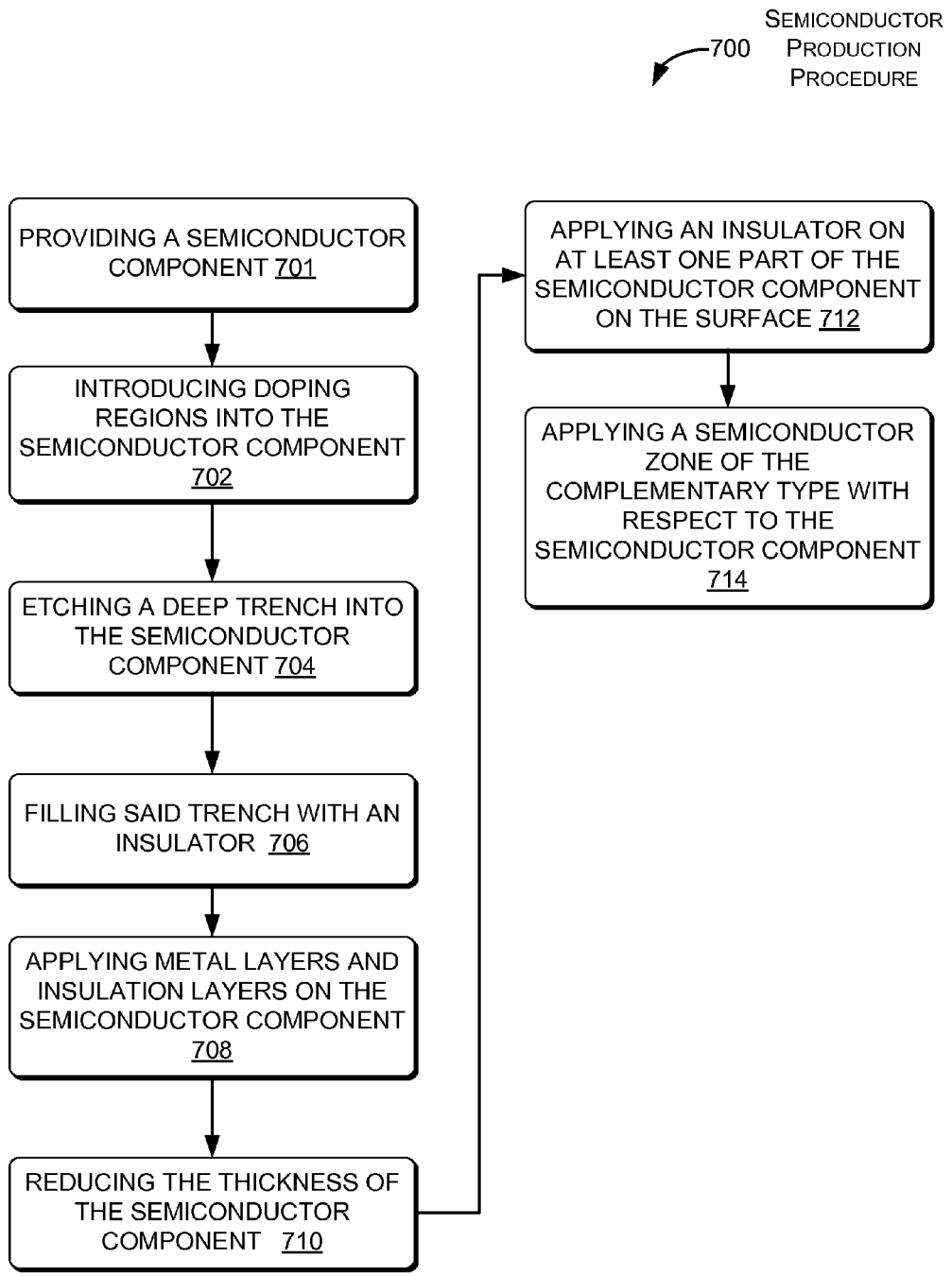
FIG. 7 shows the perspective, partly sectional view of a further exemplary embodiment of a semiconductor component 100 with a device for directly electrically isolated signal transfer 700.

FIG. 7 shows a perspective, partly sectional view of an exemplary embodiment of a semiconductor component comprising at least two regions 110, 120, wherein the regions 110, 120 are electrically isolated from one another by an insulator region 400. Within both regions 110, 120, integrated components 510 are arranged on the first surface. The insulator of the insulation region completely penetrates through the semiconductor component. On the second surface, a dielectric insulator 410 is applied in a region 120. For signal transfer across the insulated regions of the semiconductor component 400, in this exemplary embodiment, an air-core coil planar transformer 700 is formed with the patterned metallization layers 210. A sufficiently thick oxide layer is provided as insulator between the windings.

The methods known for producing junction-isolated integrated circuits in bipolar, biCMOS or BCD technology can be used for producing the components 510.

Figure 8:
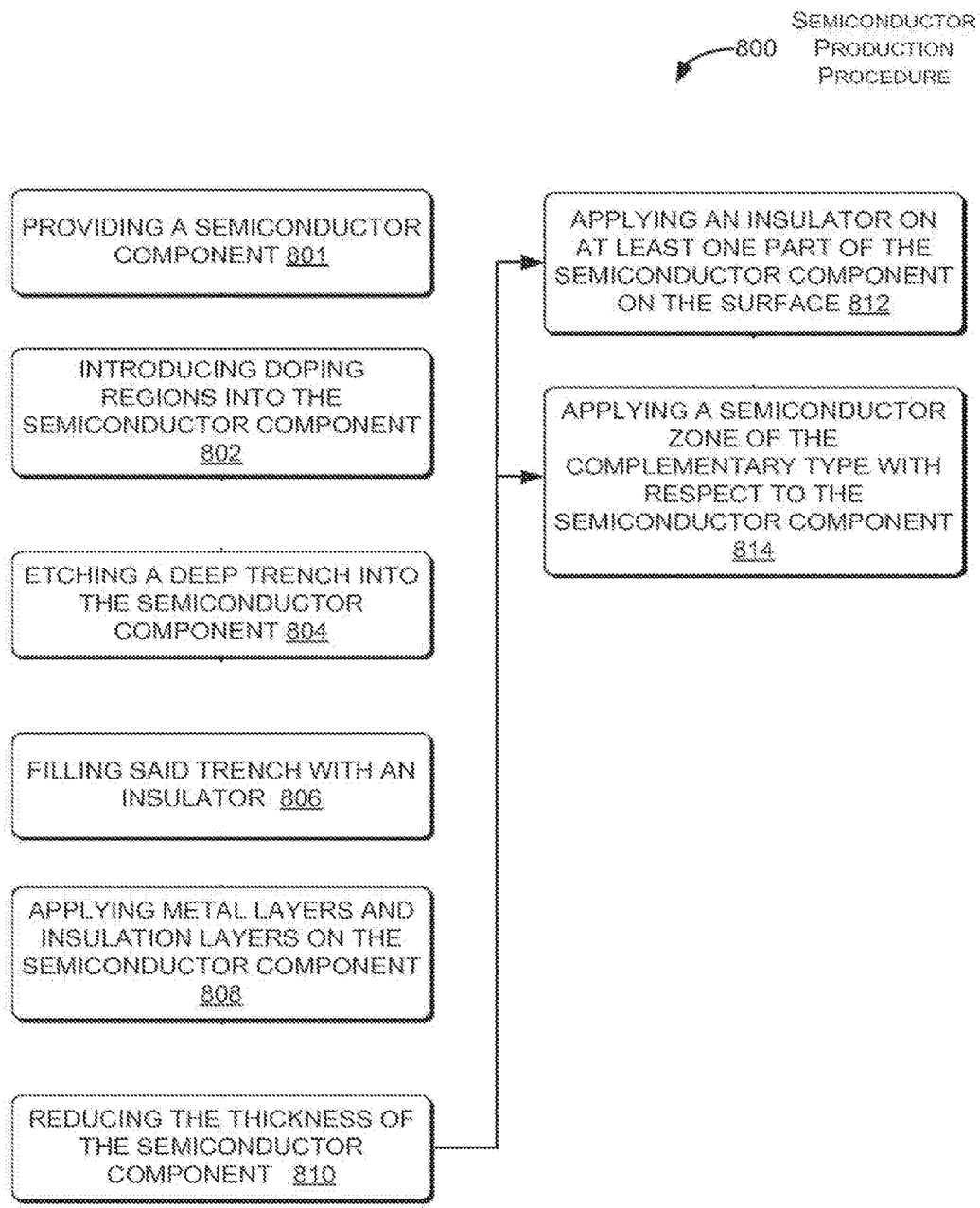
FIG. 8 illustrates a procedure for producing a semiconductor component.

FIG. 8 illustrates a procedure for producing a semiconductor component. At least one semiconductor procedure (800) may include the following Acts: providing a semiconductor component (801), introducing doping regions into the semiconductor component (802), etching a deep trench into the semiconductor component (804), filling said trench with an insulator (806), applying metal layers and insulation layers on the semiconductor component, at least one of the metal layers abutting the insulator and the semiconductor component (808), and reducing the thickness of the semiconductor component until the trench with the insulator completely penetrates through the semiconductor component (810). Furthermore, the procedure (800) may include applying an insulator on at least one part of the semiconductor component on the surface after the reduction of the thickness (812) and applying a semiconductor zone of the complementary type with respect to the semiconductor component on at least one part of the semiconductor component on the surface after the reduction of the thickness (814). The foregoing Acts may be implemented in the order described, or in another order than that described.

In a further embodiment the semiconductor component comprises a semiconductor component comprising at least two regions, wherein integrated components are applied on a first surface of the semiconductor component, wherein the regions of the semiconductor component are electrically isolated from one another by an insulation region, wherein at least two patterned layers are arranged above the first surface of the semiconductor component, the semiconductor component top side, wherein at least one of the at least two patterned layers contains an oxide or a nitride, and wherein at least one of the at least two patterned layers contains a metal. Individual circuit parts of a monolithically integrated circuit can be cut out by means of a trench etch reaching through the semiconductor component thickness, and the etched trenches can be filled with an insulator (oxide, nitride). A complete filling of the trench with an oxide or a nitride or a mixture is not absolutely necessary. The trench can likewise have conductive regions suitable for electrically connecting the regions of the semiconductor component top side to regions of a second surface of the semiconductor component, the semiconductor component underside. The semiconductor component underside is likewise insulated by means of an oxide and/or nitride layer or by means of a blocked PN junction at least in the region of the circuit parts cut out.

The semiconductor component can also be used in the field of integrated low-voltage power circuits, for example in automotive electronics. For this purpose, the semiconductor component can be conductively connected to a semiconductor component carrier (for example a leadframe or a heat sink) over the whole area. The semiconductor component regions are conductively connected to one another via the semiconductor component carrier, but no minority carriers in the semiconductor component can flow across the insulation. If, by way of example, a plurality of integrated power switches are positioned in insulated semiconductor component regions and thereby insulated from one another and from sensitive circuit parts containing bipolar transistors (bandgap reference, thermal fuse), then any electromagnetic interference influencing at one of the power switches cannot lead to a malfunction of another power switch or of a central function since no minority carriers are injected into the semiconductor component from the interference-influenced power switch.

In one embodiment, the regions of the semiconductor component have a minimum distance of 10 µm with respect to one another. Insulator materials such as nitride or oxide or mixed materials rarely attain breakdown field strengths that are greater than 1 kV/1 µm if very deep trenches are filled therewith. For applications in a high voltage technology, therefore, a minimum distance of 10 µm is necessary in order to attain a dielectric strength of 1 kV with a sufficient safety margin.

In one embodiment, the semiconductor component is thicker than 100 µm. Although thinner semiconductor components facilitate the introduction of the trench into the semiconductor component, they increase the costs for mounting into the housing on account of the poorer handleability.

In one embodiment, the insulator has at least approximately the same coefficient of expansion as the at least two regions of the semiconductor component.

In one embodiment of an insulator having approximately the same coefficient of expansion, the insulator comprises at least 10% silicon oxide and at least 80% nitride.

In one embodiment of the semiconductor component comprising at least two regions and a second surface, lying opposite the first surface, a semiconductor zone of the complementary type with respect to the semiconductor component can be provided in the second surface in at least one region of the semiconductor component.

In one embodiment of the semiconductor component comprising at least two regions and a second surface, lying opposite the first surface, an insulator can be provided in or on the second surface of at least one region of the semiconductor component.

In one embodiment of the insulator on the second surface of the semiconductor component, the insulator can consist of silicon oxide or nitride or a mixture of silicon oxide and nitride.

In the field of power switches, the second surface, which can form a semiconductor component underside, can be provided with a further PN junction. The permissible voltage range relative to the semiconductor component underside at the power switches is thereby extended to both polarities. If, furthermore, in the field of sensitive analog circuits (bandgap reference, thermal fuse, analog amplifier), the semiconductor component underside is connected to a reference potential without a PN junction with an ohmic contact, a capacitive crosstalk from the power switches via the substrate to the analog circuits can largely be avoided.

A further embodiment provides a PN junction by means of a P-type buried in an N-doped basic semiconductor component. The N- and P-type wells for the CMOS logic are then integrated above said P-type buried layer, which is at ground. The individual circuit parts (high-side and low-side) are laterally insulated from one another by the regions of the semiconductor component. If the semiconductor component underside of the semiconductor component constructed in this way is always at the highest voltage that occurs, the circuit parts are insulated from one another and mutual influencing is effectively suppressed.

In one embodiment of the semiconductor component, a device for directly electrically isolated signal transfer can be formed between at least two regions of the semiconductor component.

In one embodiment, the device for directly electrically isolated signal transfer can be formed as an air-core coil transformer.

In one embodiment, the device for directly electrically isolated signal transfer can have a light transmitter and a light receiver, which are designed to transmit and to receive light pulses from one part to another part of the semiconductor component through the insulator.

A signal transfer across the insulating regions of the semiconductor component can be effected by means of air-core coil planar transformers realized in the patterned metallization layers. A sufficiently thick oxide layer is to be provided as insulator between the windings. In order to lead out again the inner connections of planar coils having a plurality of turns, at least four patterned metallization layers and a sufficiently thick oxide layer or at least three patterned metallization layers and two sufficiently thick oxide layers are required. In another embodiment coils having only one turn can also be used. There is also the possibility of leading out the inner connection of a coil in the topmost metallization layer by means of a bonding wire, such that metallization layers are saved. Instead of an oxide layer, some other insulator material can also be used as insulator between windings.

Instead of air-core coil planar transformers, a capacitive coupling can be used for the signal transfer. Only two metallization layers are required for a capacitive coupling with signals that are in antiphase.

If light pulses are used for the signal transfer, a transmitter and a receiver can be isolated from one another by a region filled with an oxide or nitride. The insulator between two regions of the semiconductor component then transfers the light from the transmitter to the receiver.

The electrical isolation of at least two regions of the semiconductor component by means of an insulator thus can combine features of a multichip technology with the features of a monolithic semiconductor technology, for example high packing density, short signal transit times and small housings in conjunction with overall low production costs. In order to improve the heat dissipating capability, a thick metallization, for example a thick copper metallization, can be used on the first surface, which can form a semiconductor component top side.

In one embodiment a component arrangement for the mounting of a semiconductor component comprising at least two regions which are electrically isolated by an insulator comprises: a semiconductor component comprising at least two semiconductor regions, wherein the semiconductor regions of the semiconductor component are electrically isolated from one another by an insulator, and a deposited, patterned, metallic layer extends over the semiconductor regions and over the insulator, a leadframe, an electrically insulating adhesive for connecting the semiconductor component to the leadframe.

If regions of a surface, lying opposite the deposited, patterned, metallic layer, of the semiconductor component are provided with an insulator or with a semiconductor zone of the complementary type with respect to the semiconductor component, the adhesive for connecting the semiconductor component to the leadframe can be electrically conductive.

In one configuration of the component arrangement, in which regions of the surface, lying opposite the deposited, patterned, metallic layer, of the semiconductor component are provided with an insulator or with a semiconductor zone of the complementary type with respect to the semiconductor component, the adhesive for connecting the semiconductor component to the leadframe can be electrically conductive or insulating.

In one configuration of the component arrangement, the component arrangement is encapsulated by a molding compound.

A method for producing a semiconductor component comprising at least two regions comprises: providing a semiconductor component, introducing doping regions into the semiconductor component, etching a deep trench into the semiconductor component, filling said trench with an insulator, applying metal layers and insulation layers on the semiconductor component, reducing the thickness of the semiconductor component until the trench 400 with the insulator completely penetrates through the semiconductor component.

In one configuration of the method, the thickness of the semiconductor component is reduced by grinding the semiconductor component underside.

In one configuration of the method, after the reduction of the thickness, an insulator is applied on at least one part of the semiconductor component, on the semiconductor component underside.

In one configuration of the method, after the reduction of the thickness, a semiconductor zone of the complementary type with respect to the semiconductor component is applied on at least one part of the semiconductor component on the semiconductor component underside.

In order to reduce mechanical stresses, the trench can be filled with porous SiO2 or with a layer system of oxide, polysilicon, oxide. If the wafers having a thickness of approximately 800 (m during the trench etch are subsequently ground back to a wafer thickness that is smaller than the depth of the trench etch, mutually insulated semiconductor component regions arise which can be put at different voltage potentials.

The trenches in one embodiment are wide enough to form a dielectric strength between the semiconductor component regions which is significantly greater than the dielectric strength of the PN junctions produced at the semiconductor component top side. In order that the semiconductor component regions also remain insulated from one another at the second surface, the semiconductor component underside, an insulating adhesive can be used in one embodiment for the mounting. Underside insulations having a higher blocking capability can be formed if a further insulating layer composed of an oxide, nitride, imide or a mixed form is applied either over the whole area or in patterned fashion at least below the insulated semiconductor component regions. In the case of a patterned insulation, the semiconductor material can be etched back somewhat beforehand in the region of the insulated semiconductor component regions. The patterning on the underside can be aligned on the basis of the isolation trenches reaching through the semiconductor component 100.

The semiconductor component provided can consist of a cost-effective P-conducting substrate material produced according to the Czochralski method and having a conductivity of 8 Ωcm, for example. Significantly more expensive substrate materials having a conductivity of 50 to 100 Ωcm are normally required for integrated high-voltage circuits, said materials being produced by the significantly more expensive float zone method. Finely patterned analog and digital circuits composed of MOS and bipolar transistors can be formed on the semiconductor component top side. In particular, there are no restrictions with regard to the use of bipolar transistors in an insulated region.

The invention claimed is:

1. A semiconductor device comprising:
   a semiconductor component comprising a first semiconductor region and a second semiconductor region;
   an insulator configured to electronically isolate the first and second semiconductor regions from one another, the insulator completely penetrating through the semiconductor component in a vertical direction;
   a deposited, patterned, metallic layer extending over the first and second semiconductor regions and over the insulator; and
   an insulation layer applied on a surface of the second semiconductor region that is lying opposite the deposited, patterned, metallic layer,
   wherein the insulation layer encompasses the second semiconductor region such that the insulation layer forms an entire exposed surface of the semiconductor component at the second semiconductor region, and
   wherein at least a portion of the first semiconductor region forms an exposed surface of the semiconductor component at the first semiconductor region and opposite the deposited, patterned, metallic layer.

2. The semiconductor device of claim 1, wherein the first and second semiconductor regions of the semiconductor component have a minimum distance of 10 μm with respect to one another.

3. The semiconductor device of claim 1, wherein the semiconductor component is thicker than 100 μm.

4. The semiconductor device of claim 1, wherein the insulator has at least approximately the same coefficient of expansion as the first and second semiconductor regions of the semiconductor component.

5. The semiconductor device of claim 1, wherein the insulator comprises at least 10% silicon oxide and at least 80% nitride.

6. The semiconductor device of claim 1, further comprising a basic doping, wherein a semiconductor zone of the complementary type with respect to the basic doping of the semiconductor component is provided in the surface of at least one semiconductor region of the semiconductor component.

7. The semiconductor device of claim 1, wherein the insulation layer contains silicon oxide or nitride.

8. A method for producing a semiconductor device, comprising:
providing a semiconductor component;
introducing doping regions into the semiconductor component to form first and second semiconductor regions;
etching a deep trench into the semiconductor component, the deep trench separating the first and second semiconductor regions;
filling said trench with an insulator;
applying metal layers and insulation layers on the semiconductor component, at least one of the metal layers extending over the insulator and the first and second semiconductor regions of the semiconductor component;
reducing the thickness of the semiconductor component until the trench with the insulator completely penetrates through the semiconductor component; and
applying an insulation layer on at least one part of the semiconductor component on an underside surface of the semiconductor component after the reduction of the thickness, the insulation layer at least abutting the insulator,
wherein the insulation layer encompasses the second semiconductor region such that the insulation layer forms an entire exposed surface of the semiconductor component at the second semiconductor region, and
wherein at least a portion of the first semiconductor region forms an exposed surface of the semiconductor component at the first semiconductor region.

9. The method of claim 8, wherein the thickness of the semiconductor component is reduced by grinding an underside surface of the semiconductor component.

10. The method of claim 8, further comprising applying a semiconductor zone of the complementary type with respect to the semiconductor component on at least one part of the semiconductor component on the underside surface at the second semiconductor region after the reduction of the thickness.

11. The method of claim 8, wherein the insulation layer abuts a lateral surface of the first insulator.

12. The semiconductor device of claim 1, wherein the insulation layer abuts a lateral surface of the insulator.

13. The semiconductor device of claim 1, wherein a device for directly electrically isolated signal transfer is formed in the first semiconductor region of the semiconductor component.

14. The semiconductor device of claim 13, wherein the device for directly electrically isolated signal transfer is formed as an air-core coil transformer.

15. The semiconductor device of claim 13, wherein the device for directly electrically isolated signal transfer has a light transmitter and a light receiver, which are designed to transmit and to receive light pulses from one part to another part of the semiconductor component through the insulator.

* * * * *